United States Patent
Kang et al.

(10) Patent No.: US 7,132,872 B2
(45) Date of Patent: Nov. 7, 2006

(54) APPARATUS AND METHOD FOR GENERATING A PHASE DELAY

(75) Inventors: Han-Chang Kang, Taipei Hsien (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 3 days.

(21) Appl. No.: 10/710,175

(22) Filed: Jun. 23, 2004

(65) Prior Publication Data
US 2005/0093604 A1    May 5, 2005

(30) Foreign Application Priority Data
Oct. 31, 2003    (TW)    ............... 92130568 A

(51) Int. Cl.
*H03H 11/26*    (2006.01)
(52) U.S. Cl. ...................... 327/276; 327/277
(58) Field of Classification Search ............... 327/270, 327/271, 272, 276, 277, 278; 333/138; 716/2
See application file for complete search history.

(56) References Cited

U.S. PATENT DOCUMENTS

| | | | | |
|---|---|---|---|---|
| 4,829,272 A | * | 5/1989 | Kameya ...................... 333/139 |
| 6,219,397 B1 | * | 4/2001 | Park ........................... 375/376 |
| 6,380,774 B1 | | 4/2002 | Saeki ......................... 327/119 |
| 6,637,008 B1 | * | 10/2003 | Higuchi et al. ................ 716/2 |
| 6,816,031 B1 | * | 11/2004 | Miller ........................ 333/164 |

FOREIGN PATENT DOCUMENTS

TW    556072    10/2003

* cited by examiner

*Primary Examiner*—Linh My Nguyen
(74) *Attorney, Agent, or Firm*—Winston Hsu

(57) ABSTRACT

An apparatus for generating a phase delay is disclosed. The apparatus includes a buffer utilized for buffering an input signal and then outputting an output signal; a digital to analog converter (DAC) utilized for converting a digital value representative of phase delay into a corresponding control voltage and outputting a control voltage; and a variable capacitor that has a capacitance value controlled by the control voltage. By controlling the variable capacitance value, the apparatus for generating a phase delay can adjust the phase delay between the input signal and the output signal.

52 Claims, 4 Drawing Sheets

New Sheet

APPARATUS AND METHOD FOR GENERATING A PHASE DELAY

BACKGROUND OF INVENTION

1. Field of the Invention

The present invention relates to an apparatus for generating a phase delay, and more specifically, to an apparatus for generating a phase delay, which can compensate a phase difference between input signals.

2. Description of the Prior Art

Many types of circuits, such as clock generators or RF transceivers, require signals with phase of high precision because imprecise signal phases have a large impact on the whole system performance. In regards to a multiphase clock generator, the precision of each output signal phase is also very important. The larger the phase error is, the larger the jitter of output clock signal(s) may be. For systems in need of precise clock signals, such jitter may result in serious performance degradation in circuits of the following stages, such as erroneous sampling operation of an ADC (analog to digital converter) or an increased bit error rate.

When designing a circuit, it is necessary to be very cautious when considering routing paths that involve signals in need of highly precise signal phases. However, because a number of factors, such as temperature, manufacturing process variations and fluctuations in supply voltage, cannot be completely controlled, conventional VLSI circuits alone usually cannot provide precise phase delays, necessitating the use of additional mechanisms to correct the shifts in signal phases.

One of the techniques of phase adjusting is, by charging/discharging a capacitor, to insert an RC delay to a signal transmitted to circuits in the next stage. In general, a plurality of switches are respectively utilized to connect/disconnect a plurality of capacitors, so as to adjust the capacitance value, and the capacitance value in conjunction with a buffer is utilized to provide an RC delay to delay the phase of the signal.

Please refer to FIG. 1. OLE_LINK1FIG. 1 shows a block diagram of such a typical apparatus 100 for generating a phase delay. OLE_LINK1 The apparatus 100 contains a plurality of capacitors, a plurality of switches, and a buffer, and is utilized to generate an output signal by delaying an input signal. By turning on different combinations of switches, the capacitance value seen at a node N of the circuit can be adjusted. Turning on more switches results in a higher capacitance value at the node N, which in turn increases the amount of phase delay in the input signal.

In order to precisely control the phase delay of the transmitted signal, it is desirable that the capacitance and the resistance of the above-mentioned plurality of switches are of such insignificant values that they can be ignored when compared to the capacitance value of the plurality of capacitors and the resistance value of the buffer. Reason being if the parasitic capacitance value and resistance value brought by the switches are too large, the amount of RC delay may deviate from designated values, which is not desirable in circuit operation.

However, along with advances in technologies, a need for even further fine control of signal phase delay emerges, which in turn necessitate the use of devices (capacitors, buffers, etc) with even smaller resistance and capacitance in facilitating the RC delay. Under such circumstances, switches implemented by MOS transistors face the following dilemma: in order to minimize the capacitance value of the switch, the size of the MOS transistor needs to be as small as possible; on the other hand, in order to minimize the resistance value of the switch, the size of the same MOS transistor needs to be as large as possible. Hence, such dilemma results in difficulties in the design of the apparatus 100.

SUMMARY OF INVENTION

It is therefore one of the many objectives of the claimed invention to provide an apparatus and a method for converting a digital value representative of a phase delay to a control voltage, in order to control a variable capacitor and a buffer, so as to generate an output signal by delaying an input signal.

According to an embodiment of the claimed invention, an apparatus for generating a phase delay is disclosed. The apparatus comprises a buffer for buffering an input signal and outputting an output signal; a DAC for outputting a control voltage corresponding to a digital value representative of a phase delay; and a variable capacitor coupled to the DAC and the buffer, the capacitance value of the variable capacitor corresponding to the control voltage; wherein by controlling the capacitance value, the apparatus adjusts the phase delay between the input signal and the output signal.

According to another embodiment of the present invention, a method for generating a phase delay is also disclosed. The method comprises the following steps: buffering an input signal to generate an output signal; providing a digital value representative of a phase delay; generating a control voltage corresponding to the digital value representative of the phase delay; adjusting a capacitance value of a variable capacitor with the control voltage, to adjust the phase delay between the input signal and the output signal.

These and other objectives of the claimed invention will no doubt become obvious to those of ordinary skill in the art after reading the following detailed description of the embodiment, which is illustrated in the various figures and drawings.

DETAILED DESCRIPTION

Figure 1:
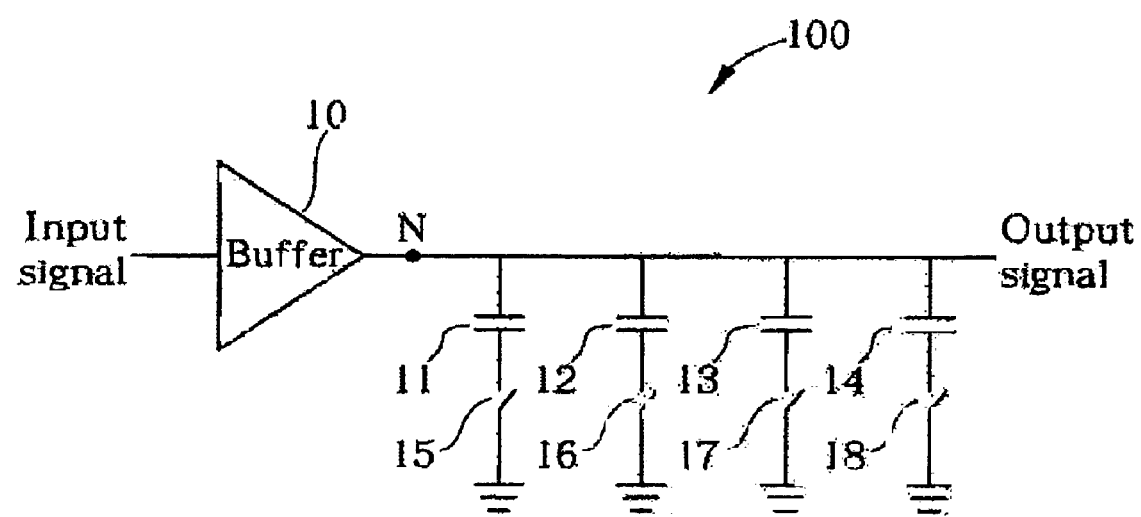
FIG. 1 shows the block diagram of a typical apparatus for generating a phase delay.
Figure 2:
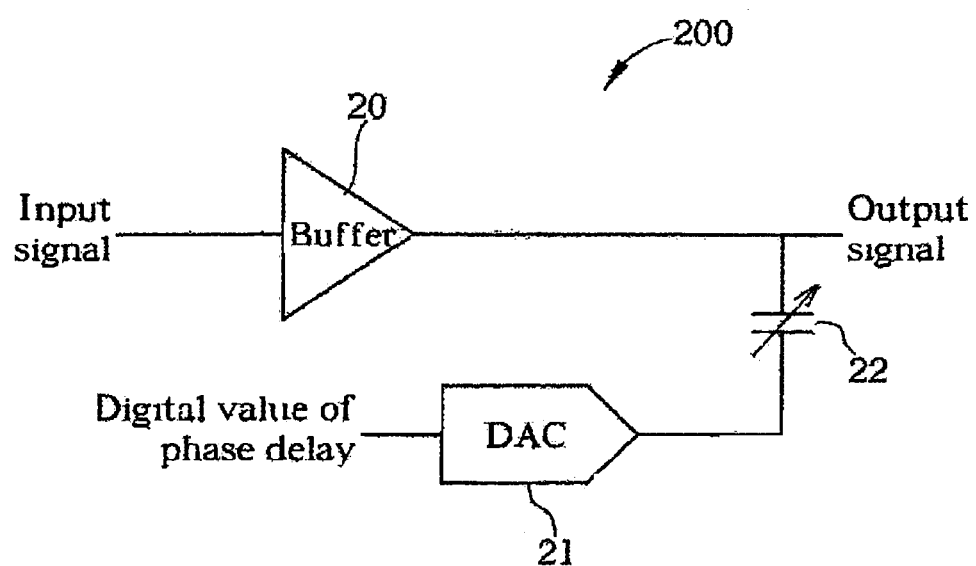
FIG. 2 is a functional block diagram of an apparatus for generating a phase delay according to an embodiment of the claimed invention.

Please refer to FIG. 2. FIG. 2 is a functional block diagram of the apparatus 200 for generating a phase delay to delay a signal according to an embodiment of the claimed invention. The apparatus 200 for generating a phase delay in FIG. 2 contains a buffer 20, a DAC 21, and a variable capacitor 22. The buffer 20 has an input end and an output end and is utilized for buffering an input signal received by the input end and generating an output signal outputted by the output end. The input signal received by the buffer 20 is usually a clock signal outputted by a clock generator or a signal outputted by an RF transceiver. The DAC 21 has an input end and an output end and is utilized to convert a digital value representative of a phase delay received by the input end into a control voltage outputted by the output end. The variable capacitor 22 has two ends. One end is electrically coupled to the output end of the DAC 21, and the other end is electrically coupled to the output end of the buffer 20, where the capacitance value of the variable capacitor 22 is determined according to the control voltage. As an embodiment, the variable capacitor 22 can be a MOS-based voltage-controlled capacitor (or a varactor), or a P+/N well junction voltage-controlled capacitor, which are well-known to those of ordinary skill in the art.

It is to be noted that two or more of the above-mentioned circuits of the claimed invention can also be implemented at the same time. In the case of two, the two circuits can respectively adjust the phases of two input signals (one input signal per circuit) in order to adjust the phase difference between the input signals, wherein the two input signals may be a pair of differential signals, or I/Q signals of a receiver and/or a transmitter of communication systems.

Figure 3:
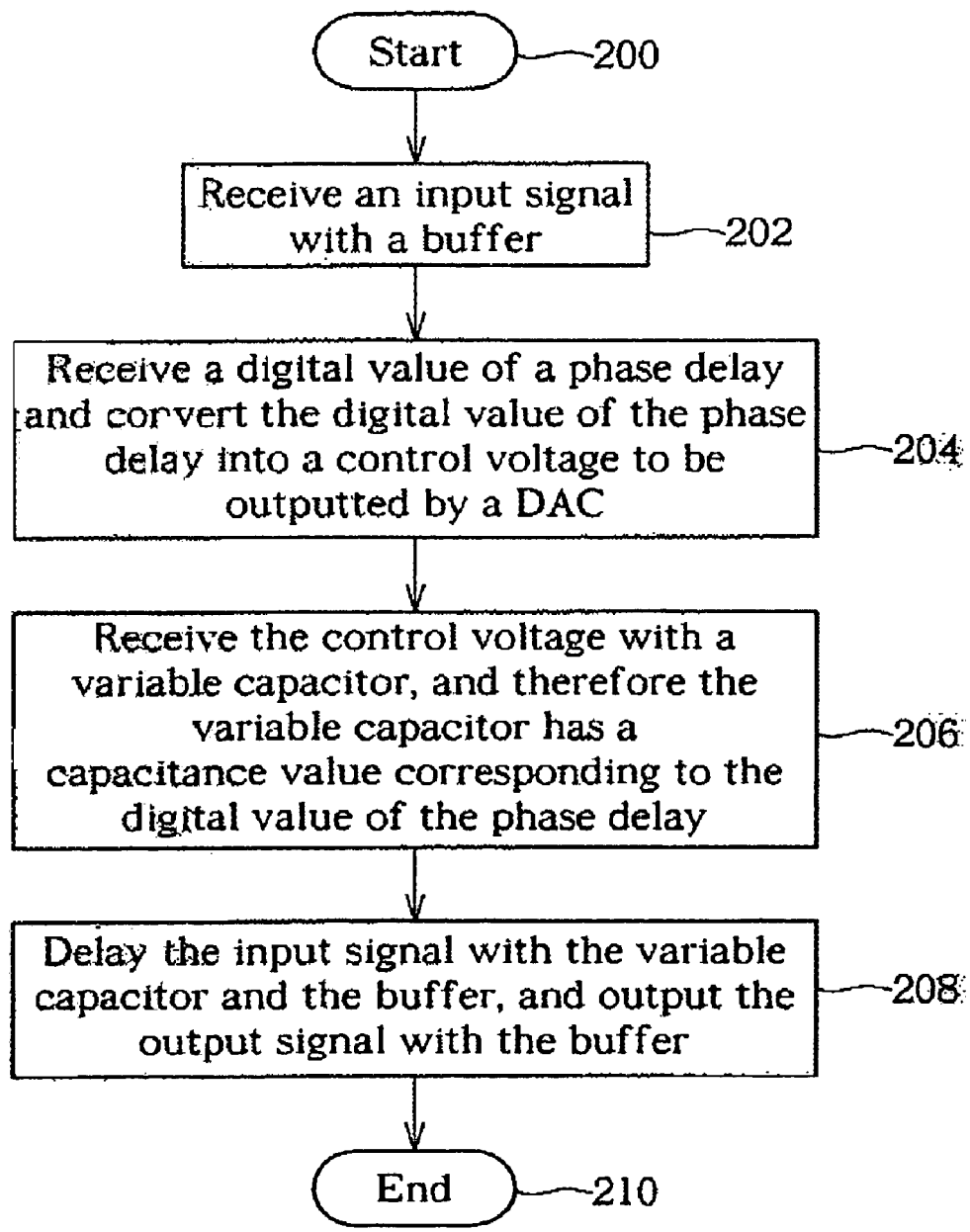
FIG. 3 is a flowchart of a delaying process employed by the apparatus for generating a phase delay according to an embodiment of the claimed invention.

FIG. 3 is a flowchart of a delaying process employed by the apparatus 200 for generating a phase delay according to an embodiment of the claimed invention. The flow process includes the following steps:

Step 200: Start;

Step 202: The input end of the buffer 20 receives an input signal;

Step 204: The input end of the DAC 21 receives a digital value representative of a phase delay. The DAC 21 converts the digital value into a corresponding control voltage and then outputs the control voltage with the output end;

Step 206: The variable capacitor 22 receives the control voltage, and the control voltage controls the variable capacitor 22 and adjusts the variable capacitor 22 to have a capacitance value corresponding to the digital value representative of the phase delay;

Step 208: Use the variable capacitor 22 and the buffer 20 to provide an RC delay, so as to delay the input signal. Then, the output signal is outputted by the output end of the buffer 20; and Step 210: End the operation of generating the phase delay, and finish the process according to the embodiment.

The capacitance value of the variable capacitor 22 varies with the control voltages (the control voltages is the value of voltage across the variable capacitor). Hence, if the voltage across the variable capacitor is controlled with a certain precision, the capacitance value with corresponding resolution can be acquired. With the state of the art technology, it is not difficult to generate a control voltage with a much higher resolution by controlling the variable capacitor with a DAC. Therefore, the precision of the phase delay can be significantly increased. In addition, since the value representative of the phase delay received by a DAC is recorded digitally, there can be a number of various detecting methods that can be used for detecting the phase difference in the previous stage.

Figure 4:
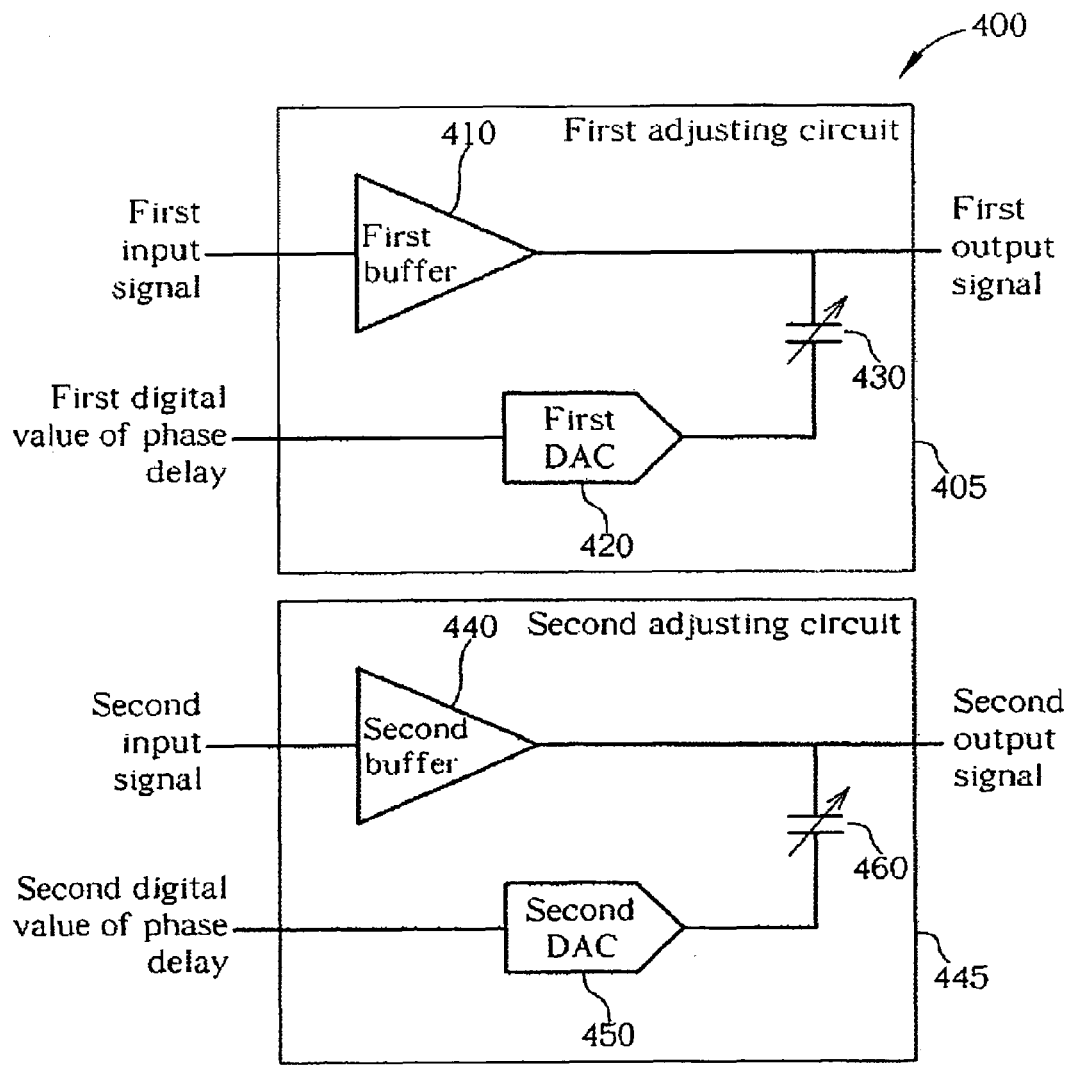
FIG. 4 is a functional block diagram of an apparatus for adjusting the phase difference between two input signals according to an embodiment of the claimed invention.

As mentioned above, two or more of the circuits shown in FIG. 2 can be implemented at the same time. An example is illustrated as below. Please refer to FIG. 4. FIG. 4 is a functional block diagram of an apparatus 400 for adjusting the phase difference between the input signals according to an embodiment of the claimed invention. The apparatus 400 comprises: a first adjusting circuit 405, comprising a first buffer 410, a first DAC 420, and a first variable capacitor 430; and a second adjusting circuit 445, comprising a second buffer 440, a second DAC 450, and a second variable capacitor 460. In this embodiment, the first adjusting circuit 405 and the second adjusting circuit 445 can respectively adjust the phases of a first input signal and a second input signal in order to adjust the phase difference between the input signals, wherein the first input signal and the second input signal may be a pair of differential signals, or I/Q signals. This embodiment may further be implemented in a receiver, a transmitter, or a transceiver. As in the circuit shown in FIG. 2. the first variable capacitor and the second variable capacitor can be voltage-controlled capacitors, such as MOS-based voltage-controlled capacitors or P+/N well junction voltage-controlled capacitors. These modifications all thus within the scope of the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An apparatus for adjusting a phase difference between two input signals, the apparatus comprising:
   a first buffer for buffering a first input signal and outputting a first output signal;
   a first DAC for outputting a first control voltage corresponding to a first digital value representative of a phase delay;
   a first variable capacitor coupled to the first DAC and the first buffer, the capacitance value of the first variable capacitor corresponding to the first control voltage;
   a second buffer for buffering a second input signal and outputting a second output signal;
   a second DAC for outputting a second control voltage corresponding to a second digital value representative of a phase delay; and
   a second variable capacitor coupled to the second DAC and the second buffer, the capacitance value of the second variable capacitor corresponding to the second control voltage;
   wherein by controlling at least one of the first and the second digital values, the phase difference between the first input signal and the second input signal is adjusted, and the first input signal and the second input signal are differential signals.

2. The apparatus of claim 1 being implemented in a receiver.

3. The apparatus of claim 1 being implemented in a transmitter.

4. The apparatus of claim 1 being implemented in a transceiver.

5. The apparatus of claim 1, wherein the first input signal and the second input signals are clock signals.

6. The apparatus of claim 1, wherein the first inptut signal and the second input signal are RF signals.

7. The apparatus of claim 1, wherein the first variable capacitor and the second variable capacitor are voltage-controlled capacitors.

8. The apparatus or claim 7, wherein the voltage-controlled capacitors are MOS-based voltage-control led capacitors.

9. The apparatus of claim 7, wherein the voltage-controlled capacitors are P+/N well junction voltage-controlled capacitors.

10. A method For adjusting a phase difference between two input signals, the method comprising:
   buffering a first input signal and outputting a first output signal;
   buffering a second input signal and outputting a second output signal;

providing at least one of a first digital value and a second digital value representative of a first phase delay and a second phase delay respectively; and adjusting at least one of a capacitance value of a first variable capacitor with a first control voltage generated from the first digital value and a capacitance value of a second variable capacitor with a second control voltage generated from the second digital value, to adjust the phase difference between the input signal and the output signal;

wherein the first input signal and the second input signal are differential signals.

11. The method of claim 10, wherein the first input signal and the second input signal are an in-phase signal and a quadrature-phase signal respectively.

12. The method of claim 10, wherein the first input signal and the second input signals are clock signals.

13. The method of claim 10, wherein the first input signal and the second input signal are RF signals.

14. The method of claim 10, wherein the first variable capacitor and the second variable capacitor are voltage-controlled capacitors.

15. The method of claim 14, wherein the voltage-controlled capacitors are MOS-based voltage-controlled capacitors.

16. The method of claim 14, wherein the voltage-controlled capacitors are P+/N well junction voltage-controlled capacitors.

17. An apparatus for adjusting a phase difference between an in-phase signal and a quadrature-phase signal, the apparatus comprising:

a first adjusting circuit, the first adjusting circuit comprising:
 a first buffer for buffering the in-phase signal and outputting a first output signal;
 a first DAC for outputting a first control voltage corresponding to a first digital value representative of a phase delay; and
 a first variable capacitor coupled to the first DAC and the first buffer, the capacitance value of the first variable capacitor corresponding to the first control voltage; and a second adjusting circuit, the second adjusting circuit comprising:
 a second buffer for buffering the quadrature-phase signal and outputting a second output signal;
 a second DAC for outputting a second control voltage corresponding to a second digital value representative of a phase delay; and
 a second variable capacitor coupled to the second DAC and the second buffer, the capacitance value of the second variable capacitor corresponding to the second control voltage;

wherein by controlling at least one of the first and the second adjusting circuit, the phase difference between the in-phase signal and the quadrature-phase signal reaches a predetermined condition.

18. An apparatus for adjusting a phase difference between a positive signal of a differential signal and a negative signal of the differential signal, the apparatus comprising:

a first adjusting circuit, comprising:
 a first buffer for buffering the positive signal and outputting a first output signal;
 a first DAC for outputting a first control voltage corresponding to a first digital value representative of a phase delay; and
 a first variable capacitor coupled to the first DAC and the first buffer, the capacitance value of the first variable capacitor corresponding to the first control voltage; and a second adjusting circuit, comprising:
 a second buffer for buffering the negative signal and outputting a second output signal;
 a second DAC for outputting a second control voltage corresponding to a second digital value representative of a phase delay; and
 a second variable capacitor coupled to the second DAC and the second buffer, the capacitance value of the second variable capacitor corresponding to the second control voltage;

wherein by controlling at least one of the first and the second adjusting circuit, the phase difference between the positive signal and the negative signal reaches a predetermined condition.

19. A method for adjusting a phase difference between an in-phase signal and a quadrature-phase signal, the method comprising:

buffering the in-phase signal and outputting a first output signal;

buffering the quadrature-phase signal and outputting a second output signal; providing at least one of a first digital value and a second digital value representative of a first phase delay and a second phase delay respectively; and adjusting at least one of a first variable capacitor and a second variable capacitor by respectively utilizing a first control voltage generated from the first digital value and a second control voltage generated from the second digital value, to have the phase difference between the in-phase signal and the quadrature-phase signal reach a predetermined condition.

20. A method for adjusting a phase difference between a positive signal of a differential signal and a negative signal of the differential signal, the method comprising:

buffering the positive signal and outputting a first output signal;

buffering the negative signal and outputting a second output signal;

providing at least one of a first digital value and a second digital value representative of a first phase delay and a second phase delay respectively; and adjusting at least one of a first variable capacitor and a second variable capacitor by respectively utilizing a first control voltage generated from the first digital value and a second control voltage generated from the second digital value, to have the phase difference between the positive signal and the negative signal reach a predetermined condition.

21. The apparatus of claim 17 being implemented in a receiver.

22. The apparatus of claim 17 being implemented in a transmitter.

23. The apparatus of claim 17 being implemented in a transceiver.

24. The apparatus of claim 17, wherein the in-phase signal and the quadrature-phase signal are RF signals.

25. The apparatus of claim 17, wherein the first variable capacitor and the second variable capacitor are voltage-controlled capacitors.

26. The apparatus of claim 25, wherein the voltage-controlled capacitors are MOS-based voltage-controlled capacitors.

27. The apparats of claim 25, wherein the voltage-controlled capacitors are P+/N well junction voltage-controlled capacitors.

28. The apparatus of claim 18 being implemented in a receiver.

29. The apparatus of claim 18 being implemented in a transmitter.

30. The apparatus of claim 18 being implemented in a transceiver.

31. The apparatus of claim 18, wherein the positive signal and the negative signal are clock signals.

32. The apparatus of claim 18, wherein the first variable capacitor and the second variable capacitor are voltage-controlled capacitors.

33. The apparatus of claim 32, wherein the voltage-control capacitors are MOS-based voltage-control capacitors.

34. The apparatus or claim 32, wherein the voltage-controlled capacitors are P+/N well junction voltage-controlled capacitors.

35. The method of claim 19, wherein the in-phase signal and the quadrature-phase signal are RF signals.

36. the method of claim 20, wherein the positive signal and the negative signal arc clock signals.

37. An apparatus for adjusting a phase difference between two input signals, the apparatus comprising:
   a first buffer for buffering a first input signal and outputting a first output signal;
   a first DAC for outputting a first control voltage corresponding to a first digital value representative of a phase delay;
   a first variable capacitor coupled to the first DAC and the first buffer, the capacitance value of the first variable capacitor corresponding to the first control voltage;
   a second buffer for buffering a second input signal and outputting a second output signal;
   a second DAC for outputting a second control voltage corresponding to a second digital value representative of a phase delay; and
   a second variable capacitor coupled to the second DAC and the second buffer, the capacitance value of the second variable capacitor corresponding to the second control voltage;
wherein by controlling at least one of the first and the second digital values, the phase difference between the first input signal and the second input signal is adjusted, and the first input signal and the second input signal are an in-phase signal and a quadrature-phase signal respectively.

38. The apparatus of claim 37 being implemented in a receiver.

39. The apparatus of claim 37 being implemented in a transmitter.

40. The apparatus of claim 37 being implemented in a transceiver.

41. The apparatus of claim 37, wherein the first input signal and the second input signal are differential signals.

42. The apparatus of claim 37, wherein the first input signal and the second input signal are clock signals.

43. The apparatus of claim 37, wherein the first input signal and the second input signal are RF signals.

44. The apparatus of claim 37, wherein the first variable capacitor and the second variable capacitor are voltage-controlled capacitors.

45. The apparatus of claim 44, wherein the voltage-controlled capacitors are MOS-based voltage-controlled capacitors.

46. The apparatus of claim 44, wherein the voltage-controlled capacitors are P+/N well junction voltage-controlled capacitors.

47. A method for adjusting a phase difference between two input signals, the method comprising:
   buffering a first input signal and outputting a first output signal;
   buffering a second input signal and outputting a second output signal;
   providing at least one of a first digital value and a second digital value representative of a first phase delay and a second phase delay respectively; and
   adjusting at least one of a capacitance value of a first variable capacitor with a first control voltage generated from the first digital value and a capacitance value of a second variable capacitor with a second control voltage generated from the second digital value, to adjust the phase difference between the input signal and the output signal;
   wherein the first input signal and the second input signal arc an in-phase signal and a quadrature-phase signal respectively.

48. The method of claim 47, wherein the first input signal and the second input signals are clock signals.

49. The method of claim 47, wherein the first input signal and the second input signal are RF signals.

50. The method of claim 47, wherein the first variable capacitor and the second variable capacitor are voltage-controlled capacitors.

51. The method of claim 50, wherein the voltage-controlled capacitors are MOS-based voltage-controlled capacitors.

52. The method of claim 51, wherein the voltaic-controlled capacitors are P+/N well junction voltage-controlled capacitors.

* * * * *